United States Patent
Fujii

(10) Patent No.: US 10,110,115 B2
(45) Date of Patent: Oct. 23, 2018

(54) SWITCHING POWER SUPPLY DEVICE WITH CONTROLLED DISCHARGE CIRCUIT

(71) Applicant: Fuji Electric Co., Ltd., Kanagawa (JP)

(72) Inventor: Masanari Fujii, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/584,286

(22) Filed: May 2, 2017

(65) Prior Publication Data

US 2017/0358981 A1 Dec. 14, 2017

(30) Foreign Application Priority Data

Jun. 9, 2016 (JP) .................................. 2016-115777

(51) Int. Cl.
| | |
|---|---|
| *H02M 1/32* | (2007.01) |
| *H02H 11/00* | (2006.01) |
| *H02M 3/02* | (2006.01) |
| *H03K 17/18* | (2006.01) |
| *H02M 1/08* | (2006.01) |
| *H02M 1/36* | (2007.01) |
| *H02M 3/335* | (2006.01) |
| *H03K 17/30* | (2006.01) |

(52) U.S. Cl.
CPC ............ *H02M 1/32* (2013.01); *H02H 11/006* (2013.01); *H02M 1/08* (2013.01); *H02M 1/36* (2013.01); *H02M 3/02* (2013.01); *H02M 3/33507* (2013.01); *H03K 17/18* (2013.01); *H02M 2001/322* (2013.01); *H03K 17/30* (2013.01)

(58) Field of Classification Search
CPC .. H02M 1/32; H02M 2001/322; H03K 17/18; H03K 3/02; H03K 17/30
See application file for complete search history.

(56) References Cited

U.S. PATENT DOCUMENTS

| | | |
|---|---|---|
| 6,351,107 B1 | 2/2002 | Okita |
| 8,054,600 B2 | 11/2011 | Nakamura |
| 8,427,225 B2 | 4/2013 | Nakatake et al. |
| 8,970,259 B2 | 3/2015 | Mori |
| 9,166,497 B2 | 10/2015 | Fujii |

FOREIGN PATENT DOCUMENTS

| | | |
|---|---|---|
| JP | 2001-078435 A | 3/2001 |
| JP | 2009-165288 A | 7/2009 |
| JP | 2011-082764 A | 4/2011 |
| JP | 2013-219633 A | 10/2013 |
| JP | 2014-64376 A | 4/2014 |
| WO | 2009/044602 A1 | 4/2009 |

*Primary Examiner* — Adolf Berhane
*Assistant Examiner* — Henry Lee, III
(74) *Attorney, Agent, or Firm* — Chen Yoshimura LLP

(57) ABSTRACT

A switching power supply device includes: a latch circuit to be set by a latch signal that is generated when an anomaly is detected, the latch circuit stopping the turning ON and OFF of the switching element when set by the latch signal; a pulse generator that receives said latch signal and generates a pulse signal at a prescribed cycle in response to said latch signal; a discharge circuit that is activated every time said pulse signal is provided so as to discharge electric charges stored in the capacitor; and a comparator for undervoltage protection that, when said control power supply voltage decreases to a prescribed operation stop voltage as said capacitor discharges, resets the latch circuit and the pulse generator, respectively.

5 Claims, 5 Drawing Sheets

SWITCHING POWER SUPPLY DEVICE WITH CONTROLLED DISCHARGE CIRCUIT

BACKGROUND OF THE INVENTION

Technical Field

The present invention relates to a switching power supply device that, after causing a power supply control device to perform a latch protection operation in accordance with a latch signal provided when an anomaly is detected, is able to quickly restart the power supply control device, which has stopped operating, thereby shortening the restart time of the power supply control device.

Background Art

A switching power supply device 1 that is able to achieve a prescribed direct current output voltage by switching an input voltage includes, as shown in FIG. 3, a switching power supply device main body 10 that is constructed using as a main component thereof a switching element Q, for example. The switching power supply device 1 further includes an integrated power supply IC 20 as a power supply control device that ON/OFF drives the switching element Q. The switching power supply device main body 10 includes: the switching element Q, which is a MOSFET or the like connected in series to an input power source (not shown) via a primary coil Tw1 of a transformer T; and a secondary-side circuit S connected to a secondary coil Tw2 of the transformer T, for example. The secondary-side circuit S is configured so as to include: a rectifier circuit that rectifies a voltage generated in the secondary coil Tw2 of the transformer T; an output capacitor that achieves a prescribed direct current output voltage by smoothing the rectified output of the rectifier circuit; and the like, although these components are not specifically shown.

The power supply IC (power supply control device) 20 basically includes a driver circuit 21 that ON/OFF drives the switching element Q in accordance with a PWM control signal that is based on the direct current output voltage of the secondary-side circuit S. An IC control block 22, which controls the driving of the driver circuit 21, is configured so as to include: an oscillator that generates the PWM control signal; a protection circuit for protecting the switching element Q from an overload, an overcurrent, or the like; and the like. An explanation of the PWM control signal will be omitted here since such a signal is not directly related to the present invention.

The power supply IC 20 further includes a start switch circuit 23 that operates upon receiving at an input terminal VH an input voltage applied to the primary coil Tw1 of the transformer T from the input power source. This start switch circuit 23 has the role of charging a capacitor C connected to a control power supply terminal VCC of the power supply IC 20 when the switching power supply device 1 is started up, for example. Specifically, the start switch circuit 23 has the role of, as shown by the start-up operation timing of the switching power supply device 1 shown in FIG. 4, turning ON (becoming conductive) during start-up and charging the capacitor C until the voltage at the control power supply terminal VCC reaches a prescribed operation start voltage UVLO-on (see interval 1 in FIG. 4).

When the voltage (a control power supply voltage Vcc) at the control power supply terminal VCC reaches the prescribed operation start voltage UVLO-on via the charging of the capacitor C, the IC control block 22 starts operating.

Then, under the control of the IC control block 22, the driver circuit 21 is driven and the switching of the switching element Q begins. Once the switching element Q has begun the switching operation, a coil voltage generated in an auxiliary coil Tw3 of the transformer T is applied, via the capacitor C, to the control power supply terminal VCC as the control power supply voltage Vcc, resulting in the power supply IC 20 continuing to operate.

When a protection signal is generated upon detection of an anomaly such as an overcurrent, an overload, or the like, as shown in FIG. 4, the switching operation of the switching element Q is temporarily stopped, and the switching element Q and the like are protected from the anomaly. At such time, it is difficult for voltage to be generated in the auxiliary coil Tw3 due to the switching operation of the switching element Q having stopped, and power is no longer supplied to the capacitor C. As a result, the control power supply voltage Vcc gradually decreases.

At such time, the IC control block 22 intermittently turns the start switch circuit 23 ON and OFF in order to maintain the control power supply voltage Vcc, thereby charging the capacitor C (see interval 2 in FIG. 4). As a result of this intermittent charging of the capacitor C during a protective operation period, the control power supply voltage Vcc does not decrease to an operation stop voltage UVLO-off of the IC control block 22 and is kept at a voltage at which it is possible to keep the IC control block 22 operating.

Thereafter, when the protection signal stops as a result of the cause of the previously-mentioned anomaly being eliminated, the power supply IC 20 restarts. Under the control of the IC control block 22, the switching operation of the switching element Q resumes (see interval 3 in FIG. 4). However, at such time, the voltage (control power supply voltage Vcc) of the capacitor C will undoubtedly decrease temporarily as drive current is provided to the switching element Q. In order to suppress this temporary decrease in the control power supply voltage Vcc as much as possible and stabilize this voltage so as to be greater than or equal to the operation stop voltage UVLO-off, a capacitor C that has a relatively large capacitance (22 μF, for example) is used.

In contrast, in a case where the anomaly is more serious than in the previously-mentioned case where an overload or an overcurrent was detected, such as a case in which overheating of the switching element Q is detected, the operation of the switching power supply device 1 is immediately stopped and a latch signal for preventing the thermal destruction of the switching element Q is generated. A latch circuit 25 has the role of being set once such a latch signal is received and then forcibly stopping the operation of the driver circuit 21. This forcible stoppage of the operation of the driver circuit 21 in accordance with the latch signal is referred to as a "latch protection operation," and this operation continues until the latch circuit 25 is reset.

During the latch protection operation, the control power supply voltage Vcc (the charging voltage of the capacitor C) gradually decreases due to the driving of the switching element Q being stopped. Then, when the control power supply voltage Vcc has decreased to the operation stop voltage UVLO-off, this state is detected by a comparator 24 and the latch circuit 25 is reset, thereby restarting the power supply IC 20. The amount of time required from when the latch protection operation starts until the control power supply voltage Vcc is established via the restart of the power supply IC 20 is referred to as "the restart time" ("power supply restart time"). In general, it is preferable that operations resume in as short a time as possible (within 2 seconds, for example).

As a method of shortening the restart time during the above-described protection operation that is a result of the detection of an overvoltage, a method has been proposed in which an overvoltage operation prevention signal is canceled when the input voltage falls below a prescribed threshold voltage (Patent Document 1, for example). However, the method disclosed in Patent Document 1 is effective only during a protective operation for an overvoltage, and does not effectively function during a latch protection operation when the above-mentioned overheating of the switching element Q has been detected. Therefore, in order to reset the latch circuit 25, the input voltage to the switching power supply device 1 must be forcibly blocked, or the device must wait until the control power supply voltage Vcc decreases to at least the operation stop voltage UVLO-off as a result of the discharge of the capacitor C, for example.

However, as mentioned above, the capacitance of the capacitor C was set to as to be relatively large, meaning that it will undoubtedly take time for the capacitor C to discharge. Furthermore, the discharge of the capacitor C during the latch protection operation depends solely on the consumption current to the IC control block 22, which has reduced power consumption, and the like. Thus, the reset time of the latch circuit 25 is long, and it is additionally necessary to restart the power supply IC 20; thus, the restart time of the power supply IC 20 becomes long.

For this reason, the inventors of the present invention previously proposed incorporating into the power supply IC 20 a discharge circuit 26 that turns ON upon receiving the latch signal, and then forcibly discharges the electric charge in the capacitor C to a certain extent (see Patent Document 2). This forcible discharge of the capacitor C via the discharge circuit 26 is carried out until the control power supply voltage Vcc decreases to a discharge threshold voltage Vdis that has been set approximately 2V higher than the operation stop voltage UVLO-off, for example. The lowering of the control power supply voltage Vcc to the discharge threshold voltage Vdis is detected via a comparator 27.

As a result, as shown by the operation timing during the latch protection operation in FIG. 5, when the latch signal is provided, the control power supply voltage Vcc rapidly decreases to the discharge threshold voltage Vdis as a result the discharge of the capacitor C via the discharge circuit 26. Thereafter, the electric charge remaining in the capacitor C is consumed by the IC control block 22 and the like, and the control power supply voltage Vcc decreases to at least the operation stop voltage UVLO-off. The above-mentioned latch protection operation is then canceled via the resetting of the latch circuit 25, which occurs once the control power supply voltage Vcc has decreased.

RELATED ART DOCUMENTS

Patent Documents

Patent Document 1: Japanese Patent Application Laid-Open Publication No. 2009-165288
Patent Document 2: Japanese Patent Application Laid-Open Publication No. 2014-64376

SUMMARY OF THE INVENTION

However, when the power supply IC 20 is restarted when the latch protection operation is canceled, drive current is provided to the switching element Q; thus, the voltage (the control power supply voltage Vcc) of the capacitor C will undoubtedly decrease temporarily. In order to suppress this temporary decrease in the control power supply voltage Vcc as much as possible and stabilize the control power supply voltage Vcc so as to be greater than or equal to the operation stop voltage UVLO-off, the capacitance of the capacitor C is made even larger and increased to approximately 47 μF, for example. Thus, the time required to charge the capacitor C to the prescribed control power supply voltage Vcc during the restart of the switching power supply device 1 becomes longer. In addition, even though the capacitor C is discharged via the discharge circuit 26 during the latch protection operation, the time for the control power supply voltage Vcc to decrease to the discharge threshold voltage Vdis will undoubtedly become longer as the capacitance of the capacitor C becomes larger.

Meanwhile, the power consumption of the power supply IC 20 is reduced even further, and the consumption current of the IC control block 22 and the like during the latch protection operation is minimized. Thus, when the latch protection operation is performed, the time for the control power supply voltage Vcc, which decreased to the discharge threshold voltage Vdis as a result of the discharge of the capacitor C via the discharge circuit 26 described above, to thereafter further decrease to at least the operation stop voltage UVLO-off as a result of the power consumption of the IC block 22 and the like becomes longer.

Therefore, the amount of time required for the latch circuit 25 to reset during the latch protection operation will undoubtedly increase as a result of the increase in the capacitance of the capacitor C and the decreased power consumption of the power supply IC 20. Furthermore, since it is necessary to charge the capacitor C by restarting the power supply IC 20 after the latch circuit 25 has been reset, it is difficult to keep the amount of time required (the power supply restart time) from the start of the latch protection operation to the restart of the power supply IC 20 to within the above-mentioned 2 seconds.

The present invention was designed with the above-mentioned circumstances in mind, and an aim thereof is to provide a switching power supply device that is able to shorten the restart time of a power supply control device by, after causing the power supply control device (a power supply IC) to perform a latch protection operation in accordance with a latch signal provided when an anomaly is detected, quickly eliminating the latch protection operation state (latch state) in the power supply control device that lead to an operation stop state and then restarting the power supply control device. Accordingly, the present invention is directed to a scheme that substantially obviates one or more of the problems due to limitations and disadvantages of the related art.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a switching power supply device, including: a switching power supply device main body that achieves a prescribed direct current output voltage by switching an input voltage via a switching element; a power supply control device that turns the switching element ON and OFF; and a capacitor that is connected to a control power supply terminal of the power supply control device to establish a control power supply voltage for the power supply control device, wherein the power supply control device comprises: a latch circuit to be set by a latch signal that is generated when an anomaly is detected, the latch circuit stopping the turning ON and OFF of the switching element when set by the latch signal; a pulse generator that receives the latch signal and generates a pulse signal at a prescribed cycle in response to the latch signal; a discharge circuit that is activated every time the pulse signal is provided so as to discharge electric charges stored in the capacitor; and a comparator for undervoltage protection that, when the control power supply voltage decreases to a prescribed operation stop voltage as the capacitor discharges, resets the latch circuit and the pulse generator, respectively.

In one aspect of the above-mentioned invention, it is preferable that the discharge circuit include a semiconductor switch that turns ON in response to the pulse signal as a trigger to discharge the capacitor.

In one aspect of the above-mentioned invention, it is preferable that the discharge circuit be activated when a first pulse signal is received, continue to discharge the capacitor until the control power supply voltage decreases to a prescribed discharge threshold voltage that is higher than the prescribed operation stop voltage as the capacitor discharges, and is turned off thereafter, and that the discharge circuit be re-activated when a second pulse signal is received, and continue to discharge the capacitor until the control power supply voltage decreases further to the prescribed operation stop voltage and the latch signal is cancelled.

In one aspect of the above-mentioned invention, it is preferable that the power supply control device be an integrated circuit and the capacitor be a high-capacity capacitor externally attached to the control power supply terminal of the integrated power supply control device.

In one aspect of the above-mentioned invention, it is preferable that the switching element of the switching power supply device main body induce the direct current output voltage in a secondary coil side of a transformer by switching the input voltage via a primary coil of the transformer, and that the capacitor provide to the power supply control device, as the control power supply voltage, a voltage that has been induced in an auxiliary coil of the transformer and that has been rectified and smoothed.

According to the switching power supply device configured in such a manner, even if the capacitor connected to the power supply control device (power supply IC) has a large capacitance, the discharge circuit is caused to turn ON via a pulse signal of a prescribed cycle that is generated by a pulse generator upon receiving a latch signal generated when an anomaly is detected. As a result, it is possible to cause the control power supply voltage to decrease all the way to a prescribed discharge threshold voltage by causing the electric charge stored in the capacitor to be forcibly discharged via the discharge circuit. Thereafter, in a case in which the control power supply voltage has not decreased to the operation stop voltage, it is possible to cause the control power supply voltage to quickly decrease to the operation stop voltage by causing the electric charge remaining in the capacitor to be forcibly discharged once again via the discharge circuit by means of the pulse signal generated by the pulse generator.

As a result, even in a case in which a capacitor with a large capacitance is used and the power consumption of the power supply control device is further reduced, it is possible to shorten the duration of the latch protection operation of the power supply control device, or in other words, the amount of time required until the latch protection operation is canceled, when an anomaly is detected. Therefore, it is possible to sufficiently shorten the restart time of the power supply control device after the latch protection operation has been carried out. Thus, it is possible to keep the amount of time (power supply restart time) required from the latch protection operation, which occurs when an anomaly is detected, to the restart of the power supply control device to within the generally desired 2 seconds, for example.

It is to be understood that both the foregoing general description and the following detailed description are exemplary and explanatory, and are intended to provide further explanation of the invention as claimed.

DETAILED DESCRIPTION OF EMBODIMENTS

A switching power supply device according to an embodiment of the present invention will be explained hereafter with reference to the drawings.

Figure 1:
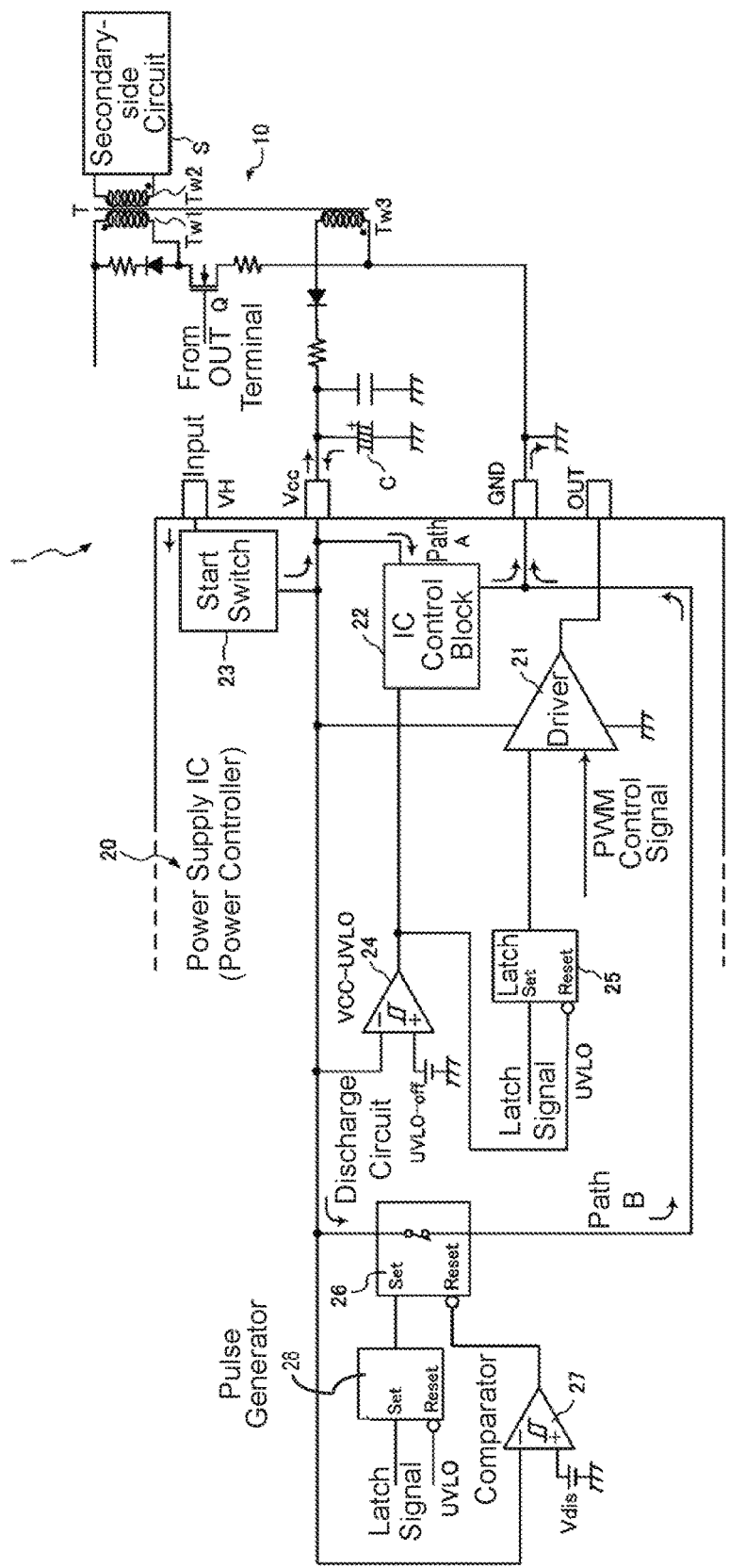
FIG. 1 is a schematic configuration diagram of the main components of a switching power supply device according to an embodiment of the present invention.
Figure 2:
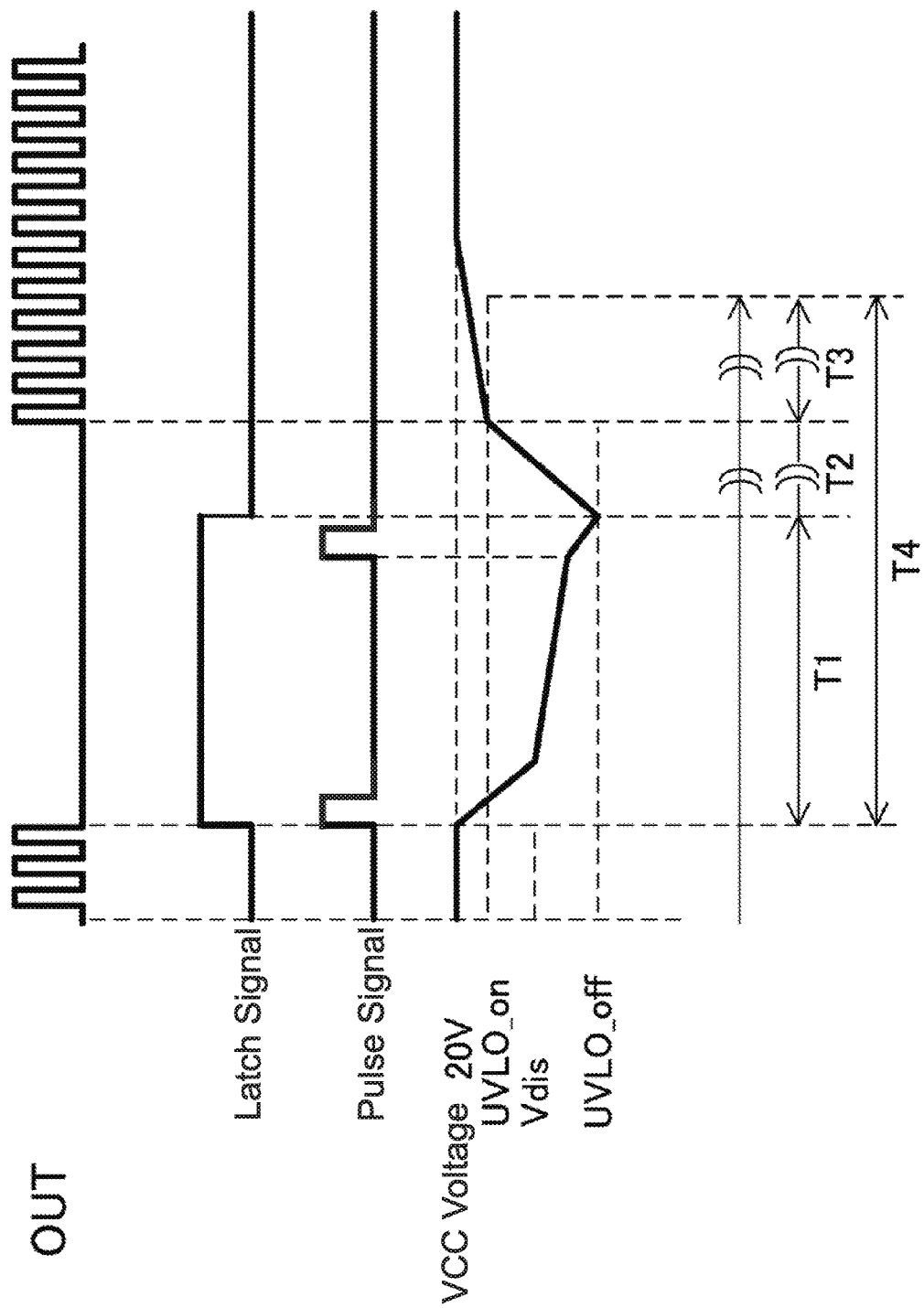
FIG. 2 is a timing diagram that shows a latch protection operation of the power supply control device shown in FIG. 1.
Figure 3:
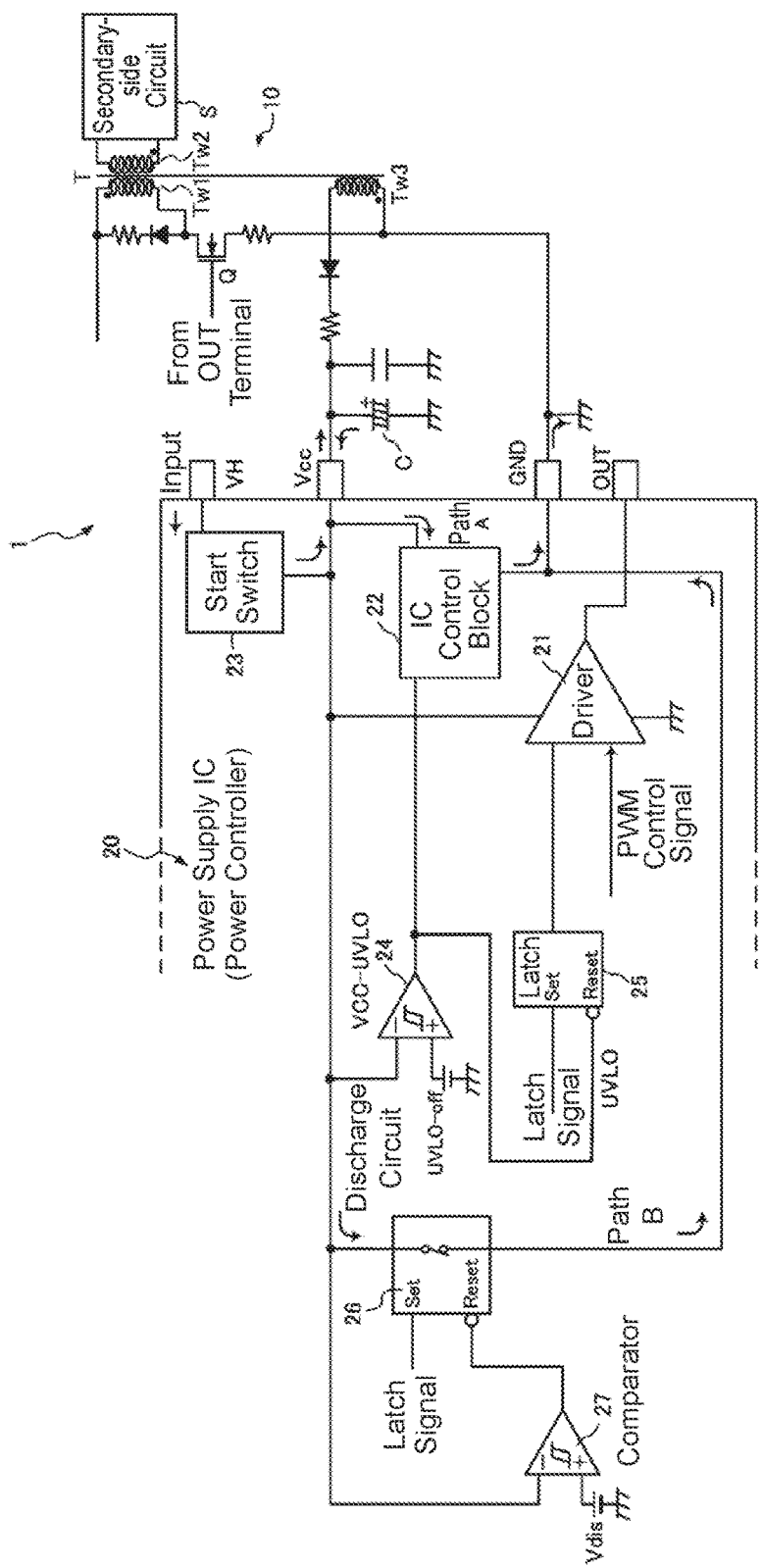
FIG. 3 is a schematic configuration diagram of the main components of one example of a conventional switching power supply device.
Figure 4:
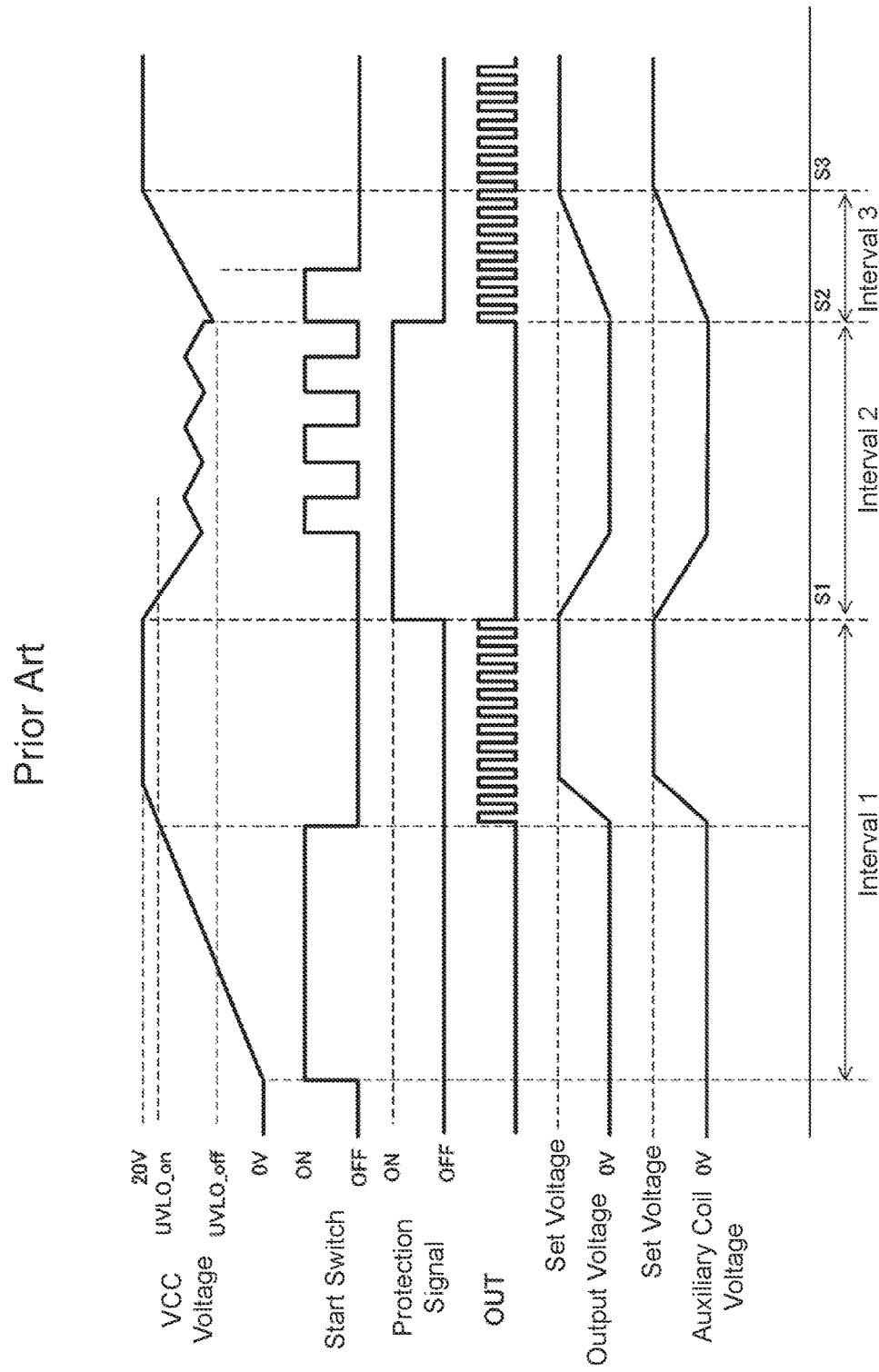
FIG. 4 is a timing diagram that shows the operation of the power supply control device shown in FIG. 3 during a restart.
Figure 5:
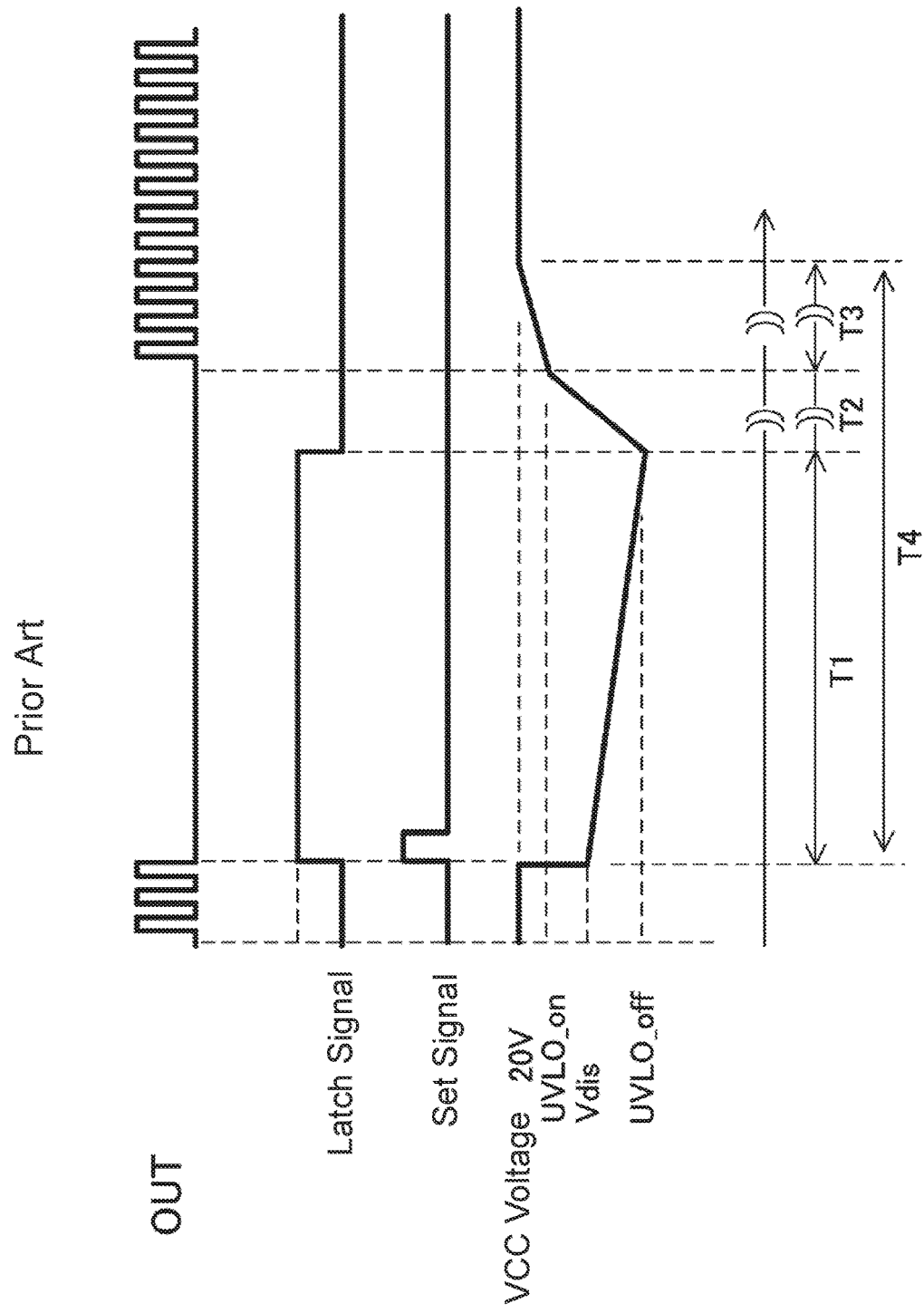
FIG. 5 is a timing diagram that shows a latch protection operation of the power supply control device shown in FIG. 3.

FIG. 1 is a schematic configuration diagram of the main components of a switching power supply device 1 according to an embodiment of the present invention. FIG. 2 shows the timing of a latch operation in a power supply control device (power supply IC) 20 of the switching power supply device 1 shown in FIG. 1. Parts similar to those of the conventional switching power supply device 1 shown in FIG. 3 are assigned the same reference characters and descriptions thereof are omitted.

This switching power supply device 1 is characterized by basically including, in the power source IC 20, a discharge circuit 26 for forcibly discharging electric charge stored in a capacitor C. In addition, the power supply IC 20 specifically includes a pulse generator 28 that is set by receiving a latch signal that sets a latch circuit 25 and then turns the discharge circuit 26 ON by generating a pulse signal at a prescribed cycle. The power supply IC 20 further includes a comparator 27 that compares a control power supply voltage Vcc applied to a control power supply terminal VCC and a preset discharge threshold voltage Vdis, and then resets the discharge circuit 26 when the control power supply voltage Vcc decreases to the discharge threshold voltage Vdis.

The discharge threshold voltage Vdis set in the comparator 27 is set so as to be approximately 2V higher than the previously-mentioned operation stop voltage UVLO-off, for example. Therefore, as shown by the operation timing in FIG. 2, the discharge circuit 26 turns ON upon receiving a first pulse signal generated by the pulse generator 28 when a latch signal is received, and forcibly discharges electric charge stored in the capacitor C. Then, when the control power supply voltage Vcc applied to the control power supply terminal VCC decreases to the discharge threshold voltage Vdis as the capacitor C is discharged, the discharge circuit 26 turns OFF upon receiving the control of the comparator 27, which detects that the control power voltage Vcc has decreased to the discharge threshold voltage Vdis. Therefore, the control power supply voltage Vcc applied to the control power supply terminal VCC as the charging voltage of the capacitor C rapidly decreases to the discharge threshold voltage Vdis as a result of the forcible discharge of the capacitor C via the discharge circuit 26.

Thereafter, the electric charge that remains in the capacitor C is pulled out in accordance with the consumption current that flows to the IC control block 22 and the like during standby, and the control power supply voltage Vcc further decreases from the discharge threshold voltage Vdis as the capacitor C discharges (see period T1 in FIG. 2). However, the amount of consumption current that flows to the control block 22 and the like during standby is small as a result of the reduced power consumption of the power supply IC 20; thus, the rate at which the control power supply voltage Vcc decreases after the capacitor C has been forcibly discharged via the discharge circuit 26 is slow.

At such time, the pulse generator 28 generates a second pulse signal before the control power supply voltage Vcc decreases to the operation stop voltage UVLO-off; thus, the discharge circuit 26 turns ON again upon receiving this second pulse signal. As a result, the electric charge remaining in the capacitor C is forcibly discharged, and the control power supply voltage Vcc decreases all the way to the operation stop voltage UVLO-off as this discharge occurs.

Then, when the control power supply voltage Vcc decreases to the operation stop voltage UVLO-off, the latch circuit 25 and the discharge circuit 26 are respectively reset via the output of the previously-mentioned undervoltage protection comparator 24, which detects when the control power supply voltage Vcc has decreased to the operation stop voltage UVLO-off. As a result of this reset, the operational stoppage of the driver circuit 21 is canceled. In addition, at the same time, the output of the comparator 24 is provided to the IC control block 22, the start switch circuit 23 is turned ON (becomes conductive), and the capacitor C is once again charged by an input voltage provided via an input terminal VH (see period T2 in FIG. 2).

When the voltage (control power supply voltage Vcc) of the control power supply terminal VCC reaches the operation start voltage UVLO-on as a result of the charging of the capacitor C, the IC control block 22 begins operating. As a result, under the control of the IC control block 22, the driver circuit 21 is once again driven and the switching of the switching element Q starts again (see period T3 in FIG. 2). The switching power supply device 1 then returns to normal operation.

Here, the amount of restart time required from the stoppage (latch protection operation) of switching operations via the reception of the above-mentioned latch signal until the return to normal operation via the cancellation of the latch protection operation will be investigated. The restart time is the total time of: a time t1, which is the amount of time required for the capacitor C to discharge; an initial charging time t2 of the capacitor C via the start switch circuit 23; and a start-up time t3, which is the amount of time for the prescribed control power supply voltage Vcc to be stably achieved after the switching operation of the switching element Q has begun.

Of these times, the initial charging time t2 depends solely on the ability of the start switch circuit 23 to charge the capacitor C. In addition, the start-up time t3 depends on the specifications of the switching power supply device 1, particularly the operational specifications of the switching element Q. The total (t2+t3) of these time periods is generally 1.5 seconds or so. In order to make the charging current of the capacitor C larger, it is necessary to increase the amount of current flowing to the element body that forms a part of the start switch circuit 23, for example.

Meanwhile, the time t1 required for the capacitor C to discharge depends solely on the standby consumption current of the IC control block 22 when the discharge circuit 26 is not included. When the standby consumption current of the IC control block 22 is 100 µA, the amount of time t1 for the control power supply voltage Vcc to decrease from a voltage of 20V prior to latch stoppage to the operation stop voltage UVLO-off (10V, for example) is, when the capacitance of the capacitor C is 47 µF, for example:

$$t1 = 47 \text{ µF} \times (20 \text{ V} - 10 \text{ V})/0.1 \text{ mA}$$
$$= 4.7 \text{ seconds}$$

As a countermeasure, in the conventional switching power supply device 1 shown in FIG. 3 that included a discharge circuit 26, the discharge circuit 26 was caused to operate when the latch signal was received. The electric charge charged to the capacitor C was then discharged via the discharge circuit 26, whereby the control power supply voltage Vcc was forcibly caused to decrease all the way to the discharge threshold voltage Vdis, which was only 2V higher than the operation stop voltage UVLO-off, for example.

Thereafter, the capacitor C was discharged via current that was pulled to the standby consumption current of the IC control block 22, whereby the time t1 for the control power supply voltage Vcc to decrease to the operation stop voltage UVLO-off (10V, for example) becomes:

$$t1 = 47 \text{ µF} \times (12 \text{ V} - 10 \text{ V})/0.1 \text{ mA}$$
$$= 0.94 \text{ seconds}$$

When the previously-mentioned initial charging time t2 of the capacitor C and start-up time t3 associated with the start of the switching operation of the switching element Q are combined, the restart time required to return to normal operation via cancelling the latch protection operation becomes 2.44 seconds, and it is thus not possible to satisfy the previously-mentioned restart condition of 2 seconds or less.

As a countermeasure, in the switching power supply device 1 of the present invention shown in FIG. 1, the discharge circuit 26 is turned ON multiple times using a pulse signal of a prescribed cycle that is generated by the pulse generator 28. Specifically, the control power supply voltage Vcc is caused to decrease all the way to the discharge threshold voltage Vdis by means of the first discharge of the capacitor C via the discharge circuit 26. Thereafter, the capacitor C is caused to discharge by pulling electric charge in the capacitor C via the standby consumption current of the IC control block 22. Then, during the period in which the electric charge of the capacitor C is pulled via the standby consumption current of the IC control block 22, the discharge circuit 26 is turned back ON when the second pulse signal is output from the pulse generator 28.

Therefore, it is possible to cause the control power supply voltage Vcc, which has gradually decreased from the discharge threshold voltage Vdis by means of the discharge of the capacitor C via the IC control block 22, to decrease all the way to at least the operation stop voltage UVLO-off by means of the discharge circuit 26 turning ON for the second time. As a result, it is possible to sufficiently shorten the time t1 required for the capacitor C to discharge without affecting the consumption current of the IC control block 22. Thus, even when the previously-mentioned initial charging time t2 of the capacitor C and start-up time t3 of the switching element Q are combined, it is possible to adequately satisfy the requirement of keeping the restart time during a latch protection operation to 2 seconds or less.

Thus, according to the switching power supply device 1 configured in the above-described manner, it is possible to simply satisfy the demands of decreasing the power consumption of the IC control block 22 during standby and shortening the time period from the latch protection operation until restart occurs, which demands conventionally involved a tradeoff. Therefore, the above-described configuration will be extremely useful in the years to come since such a configuration further decreases the power consumption of the IC control block 22, increases the power conversion efficiency of the switching power supply device, and decreases power consumption during standby.

In particular, the above-mentioned configuration is able to decrease the restart time using a simple control in which the electric charge charged to the capacitor C is forcibly discharged multiple times using the discharge circuit 26, thereby shortening the time for the control power supply voltage Vcc to decrease to the operation stop voltage UVLO-off. Such a configuration therefore has a variety of practical benefits.

The present invention is not limited to the embodiment described above. It is not absolutely necessary for the above-mentioned discharge threshold voltage Vdis, which determines when the discharge circuit 26 turns OFF, to be set to a voltage in which 2V has been added to the operation stop voltage UVLO-off, and the discharge threshold voltage Vdis may be set in accordance with the required operational specifications, for example. Specifically, it is satisfactory if the discharge threshold voltage Vdis is set so as to satisfy the minimum operational stoppage period for the latch protection operation and also satisfy the previously-mentioned demands regarding the restart time.

In addition, it is satisfactory if the cycle of the pulse signal generated by the pulse generator 28 is set so as to take into consideration the power consumption of the power supply IC 20 during standby operations, and the like. Furthermore, it is also possible to configure the discharge circuit 26 so as to turn ON for fixed periods of time using the pulse signal provided from the pulse generator 28 as a trigger, for example. In such a case, the forcible discharge of the capacitor C via the discharge circuit 26 is repeatedly carried out until the control power supply voltage Vcc decreases to at least the operation stop voltage UVLO-off; thus, it is not necessary to reset the discharge circuit 26 via the comparator 27. Moreover, it is possible to appropriately apply the present invention to various previously-proposed switching power supply devices that are among the type of switching power supply devices to which the present invention can be applied. In addition, various modifications can be made without departing from the gist of the present invention.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A switching power supply device, comprising:
   a switching power supply device main body that achieves a prescribed direct current output voltage by switching an input voltage via a switching element;
   a power supply control device that turns the switching element ON and OFF; and
   a capacitor that is connected to a control power supply terminal of the power supply control device to establish a control power supply voltage for the power supply control device,
   wherein the power supply control device comprises:
      a latch circuit to be set by a latch signal that is generated when an anomaly is detected, the latch circuit stopping the turning ON and OFF of the switching element when set by the latch signal;
      a pulse generator that directly receives said latch signal and generates a pulse signal at a prescribed cycle in response to said latch signal;
      a discharge circuit that directly receives the pulse signal generated by the pulse generator and that is activated every time said pulse signal is provided so as to discharge electric charges stored in the capacitor; and
      a comparator for undervoltage protection that, when said control power supply voltage decreases to a prescribed operation stop voltage as said capacitor discharges, generates a reset signal and provide said reset signal directly to the latch circuit and the pulse generator, respectively, so as to reset the latch circuit and the pulse generator, respectively.

2. The switching power supply device according to claim 1, wherein said discharge circuit comprises a semiconductor switch that turns ON in response to said pulse signal as a trigger to discharge the capacitor.

3. The switching power supply device according to claim 1,
   wherein said discharge circuit is activated when a first pulse signal is received, continues to discharge the capacitor until the control power supply voltage decreases to a prescribed discharge threshold voltage that is higher than the prescribed operation stop voltage as the capacitor discharges, and is turned off thereafter,
   wherein said discharge circuit is re-activated when a second pulse signal is received, and continues to discharge the capacitor until the control power supply voltage decreases further to the prescribed operation stop voltage and the latch signal is cancelled.

4. The switching power supply device according to claim 1, wherein the power supply control device is an integrated circuit and the capacitor is a high-capacity capacitor externally attached to the control power supply terminal of the integrated power supply control device.

5. The switching power supply device according to claim 1, wherein the switching element of the switching power supply device main body induces said direct current output voltage in a secondary coil side of a transformer by switching said input voltage via a primary coil of the transformer, and wherein the capacitor provides to the power supply control device, as said control power supply voltage, a voltage that has been induced in an auxiliary coil of said transformer and that has been rectified and smoothed.

* * * * *